(12) United States Patent
Clark (10) Patent No.: US 7,939,455 B2
(45) Date of Patent: *May 10, 2011

(54) METHOD FOR FORMING STRAINED SILICON NITRIDE FILMS AND A DEVICE CONTAINING SUCH FILMS

(75) Inventor: Robert D. Clark, Schenectady, NY (US)

(73) Assignee: Tokyo Electron Limited, Tokyo (JP)

(*) Notice: Subject to any disclaimer, the term of this patent is extended or adjusted under 35 U.S.C. 154(b) by 556 days.

This patent is subject to a terminal disclaimer.

(21) Appl. No.: 11/529,380

(22) Filed: Sep. 29, 2006

(65) Prior Publication Data

US 2008/0081470 A1    Apr. 3, 2008

(51) Int. Cl.
*H01L 21/31* (2006.01)

(52) U.S. Cl. .......................... 438/758; 427/569

(58) Field of Classification Search ................. 438/680, 438/758, 785, 775
See application file for complete search history.

(56) References Cited

U.S. PATENT DOCUMENTS

| | | | |
|---|---|---|---|
| 2003/0215570 A1* | 11/2003 | Seutter et al. | 427/255.394 |
| 2004/0241920 A1* | 12/2004 | Hsiao et al. | 257/347 |
| 2005/0287775 A1* | 12/2005 | Hasebe et al. | 438/503 |
| 2006/0269692 A1* | 11/2006 | Balseanu et al. | 427/569 |
| 2007/0065578 A1* | 3/2007 | McDougall | 427/248.1 |

* cited by examiner

*Primary Examiner* — Quoc D Hoang
*Assistant Examiner* — Tony Tran
(74) *Attorney, Agent, or Firm* — Oblon, Spivak, McClelland, Maier & Neustadt, L.L.P.

(57) ABSTRACT

A method for forming a strained SiN film and a semiconductor device containing the strained SiN film. The method includes exposing the substrate to a gas including a silicon precursor. The substrate is exposed to a gas including a first nitrogen precursor configured to react with the silicon precursor with a first reactivity characteristic. The substrate is also exposed to a gas including a second nitrogen precursor configured to react with the silicon precursor with a second reactivity characteristic different than the first reactivity characteristic such that a property of the SiN film formed on the substrate changes to provide a strained SiN film. According to another embodiment, the substrate is exposed to a gas pulse containing a silicon precursor and first and second nitrogen precursors, wherein the ratio of the first and second precursors is varied during the exposure.

18 Claims, 6 Drawing Sheets

METHOD FOR FORMING STRAINED SILICON NITRIDE FILMS AND A DEVICE CONTAINING SUCH FILMS

FIELD OF THE INVENTION

The present invention relates to semiconductor processing methods of forming strained silicon nitride films and semiconductor devices containing the strained silicon nitride (SiN) films.

BACKGROUND OF THE INVENTION

Nitride-based films are widely used in semiconductor devices and ultra-large-scale integrated circuits. For example, nitride films have been widely used in semiconductor devices as a diffusion barrier for dopants, as an etch-stop film during etching of fine features and as a final passivation film for encapsulation of fabricated devices, among many other uses. Nitride films can be deposited at low pressure or at atmospheric pressure using a variety of processing systems and process gases. These processing systems can perform, for example, thermal chemical vapor deposition (TCVD), plasma-enhanced chemical vapor deposition (PECVD), or remote-PECVD.

Recent innovations to improve complementary metal oxide semiconductor (CMOS) transistor performance have created an industry need for strained ceramic layers compatible with current ultra-large scale integration (ULSI) techniques. In particular, channel carrier mobility for negative metal oxide semiconductor (NMOS) transistors can be increased through introduction of tensile uniaxial or biaxial strain on a channel region of the MOS transistor. Similarly, compressively strained films can be used to realize an enhancement in channel carrier mobility for positive metal oxide semiconductor (PMOS) transistors.

Conventionally, strained films have been formed by post processing of films that are compatible with existing fabrication processes. In the case of strained SiN films, for example, a SiN film is formed to a desired thickness, and then treated with ultra violet light to alter the density in a surface region of the film thereby producing the strain. Alternatively, the deposited SiN film can be treated with oxygen containing gases that replace some N in the film with O, thereby producing strain. The present inventors have recognized several problems with these conventional methods for forming strained films.

First, post processing of the deposited film increases production steps thereby reducing throughput, and may require expensive special purpose tooling. In addition, post processing of the deposited film primarily affects the film surface, which limits control of the strain amount and makes some deep treatment processes unacceptably long. Finally, conventional processes deposit the initial film by a CVD process, which can have unacceptable thickness and conformality control for many small feature manufacturing processes now in practice.

SUMMARY OF THE INVENTION

Thus, one aspect of the invention is to reduce or eliminate one or more of the above-described or additional problems associated with providing strained SiN layers.

Another aspect of the invention is to produce strain in the SiN film during forming of the film rather than by post processing.

These and/or other aspects of the invention may be provided by any of the embodiments of the present invention.

In one embodiment of the invention, a method is described for forming a strained SiN film. In another embodiment, a semiconductor device is described that includes the strained SiN film.

According to an embodiment of the invention, the method includes exposing the substrate to a gas including a silicon precursor. The substrate is exposed to a gas including a first nitrogen precursor configured to react with the silicon precursor with a first reactivity characteristic. The substrate is also exposed to a gas including a second nitrogen precursor configured to react with the silicon precursor with a second reactivity characteristic different than the first reactivity characteristic such that a property of the SiN film formed on the substrate changes to provide a strained SiN film.

According to another embodiment of the invention, the method includes exposing the substrate to a gas pulse containing a silicon precursor and first and second nitrogen precursors, where the ratio of the first and second precursors is varied during the exposure.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention describe processing methods to deposit strained SiN films utilizing a silicon precursor and different nitrogen precursors with different reactivity characteristics towards the silicon precursor. This difference in reactivity is at least in part due to the large difference in heat of formation ($\Delta H$) of the different nitrogen precursors. Ammonia ($NH_3$, $\Delta H = -45.9$ kJ/mol) and hydrazine ($N_2H_4$, $\Delta H = 95.35$ kJ/mol) are examples of nitrogen precursors with a large difference in heat of formation.

According to embodiments of the invention, the difference in reactivity of the different nitrogen precursors towards a silicon precursor is utilized to deposit SiN films having a density gradient across the film thickness. For example, using the same or similar processing conditions, a first SiN film deposited using hydrazine can have a different deposition rate and different film density than a second SiN film deposited using ammonia. In some cases this difference in density may be further affected by changing the silicon precursor and/or the processing conditions. Variations in density across the thickness of an amorphous film such as SiN will result in SiN film strain due to variations in coefficient of thermal expansion created across the SiN film. The films can be tensile-strained or compressive-strained.

In one example, embodiments of the invention may be used to produce strain on a channel region of a CMOS transistor, as noted in the Background section above. Other embodiments of the invention may be utilized for forming a strained SiN film located between materials with very different coefficients of thermal expansion, in order to increase adhesion between the materials, or to decrease the possibility of delamination during thermal cycling. More specifically, a strained SiN film disposed between different materials can be engineered according to the invention such that the film contacting the first material has a first density compatible with the first material, but is density graded to transition to a second density compatible with the second material at a contact region of the second material.

Atomic layer deposition (ALD), chemical vapor deposition (CVD), and pulsed CVD are well known methods for depositing a wide variety of materials. ALD is a CVD related film deposition method that uses sequential saturative surface reactions. In ALD, pulses of the gaseous precursors are alternately exposed to the substrate. In CVD, an uninterrupted flow of the gaseous precursors is exposed to the substrate, and in pulsed CVD, the flow of the gaseous precursor is periodically interrupted during the film deposition. The use of ALD, CVD, and pulsed CVD processing allows for varying the nitrogen precursor or ratio of nitrogen precursors during the SiN film deposition. In one example, the nitrogen precursor can be varied from hydrazine, to a combination of hydrazine and ammonia, to pure ammonia, during CVD and pulsed CVD processing. In another example, the number of hydrazine gas pulses versus ammonia gas pulses can be varied during ALD processing.

As used herein, SiN films refer to films containing silicon (Si) and nitrogen (N) as the major elements, where the elemental composition of the SiN films can be varied over wide ranges of atomic concentrations for Si and N. Furthermore, the SiN films may contain impurities such as carbon (C), oxygen (O), chlorine (Cl), and hydrogen (H), that may become incorporated into the SiN films during the ALD or pulsed CVD processing or during substrate transfer. Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane, and alkylaminosilane compounds. Examples of alkylaminosilane compounds include, but are not limited to, di-isopropylaminosilane ($H_3Si(NPr_2)$), bis(tert-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$). Examples of nitrogen precursors include, but are not limited to, ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe).

Figure 1A:
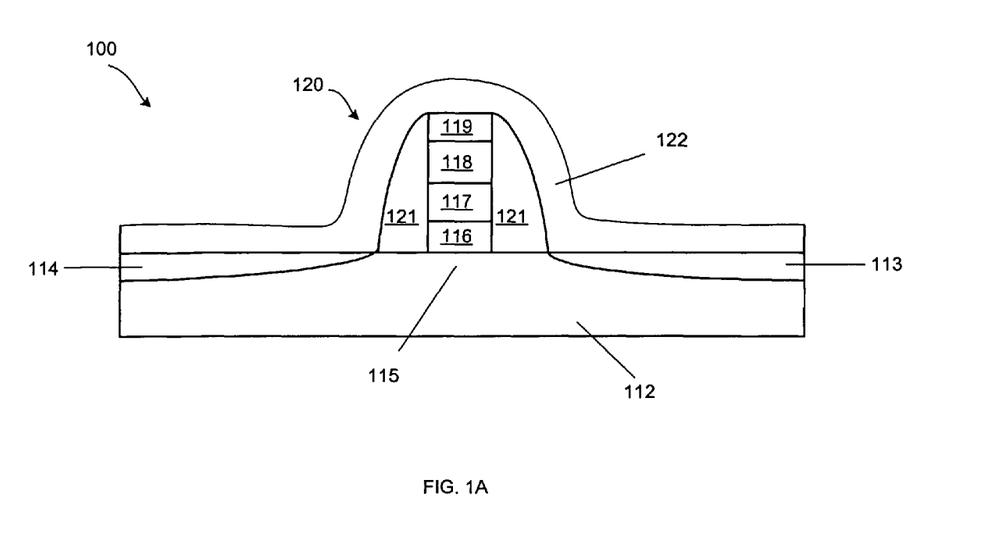
FIG. 1A schematically shows a cross-sectional view of a device containing a strained SiN film according to an embodiment of the invention.

Referring now to the drawings, FIG. 1A schematically shows a cross-sectional view of a device containing a strained SiN film according to an embodiment of the invention. The strained SiN film 122 is disposed on a MOS device 100. The device 100, as shown, also includes besides the strained SiN film 122 a substrate 112 having doped regions 113 and 114 (e.g., source and drain), a gate stack 120, and a spacer 121. The substrate 112 can for example be a Si, Ge, Si/Ge, or GaAs substrate wafer. The substrate 112 can be of any size, for example, a 200 mm substrate, a 300 mm substrate, or an even larger substrate.

The gate stack 120 includes a dielectric layer 116 on the channel region 115. The dielectric layer 116 can for example include a $SiO_2$ layer, a SiN layer, a SiON layer, or a combination thereof, or any other appropriate material. The dielectric layer 116 can further include a high-dielectric constant (high-k) dielectric material. The high-k dielectric material can for example include metal oxides and their silicates, including $Ta_2O_5$, $TiO_2$, $ZrO_2$, $Al_2O_3$, $Y_2O_3$, $HfSiO_x$, $HfO_2$, $ZrO_2$, $ZrSiO_x$, $TaSiO_x$, $SrO_x$, $SrSiO_x$, $LaO_x$, $LaSiO_x$, $YO_x$, or $YSiO_x$, or combinations of two or more thereof.

In the embodiment of FIG. 1A, a conductive layer 117 (e.g., a gate electrode layer) is formed on the dielectric layer 116, and a silicide layer 118 is formed on the conductive layer 117 to reduce the electrical resistance of the conductive layer 116. The cap layer 119 can be positioned on top of the gate stack 120 to protect the gate stack 120. The cap layer 119 can, for example, be a SiN layer.

In one embodiment of the invention, the conductive layer 117 can be doped polycrystalline silicon (poly-Si), and the silicide layer 118 can be tungsten silicide. The gate stack 120 may include different layers, fewer layers or more layers than shown in FIG. 1A. In one example, layer 117 and/or layer 118 may be replaced by a metal gate layer. FIG. 1A further shows that spacer 121 is formed on each side of the gate stack 120 in order to protect the gate stack 120 from damage and ensure electrical performance of the gate. In addition, the spacer 121 can be used as a hard mask for the formation of the source and drain 113, 114 of the MOS device 100. Alternately, in one embodiment, more than one spacer 121 may be used. Alternatively, in another embodiment the strained SiN film may be incorporated in the spacer 121.

In one embodiment, the device 100 can be a NMOS device where the strained SiN film 122 increases channel carrier mobility through introduction of a tensile stress on the channel region 115. In another embodiment, the device 100 can be a PMOS device where the strained SiN film 122 increases channel carrier mobility through introduction of a compressive stress on the channel region 115. In the embodiment of FIG. 1, the strained SiN film 122 can also serve as a final passivation film for encapsulating and protecting the device 100. However, the strained SiN film can be incorporated into the CMOS structure in a variety of ways to produce stress on the channel region 115.

Figure 1B:
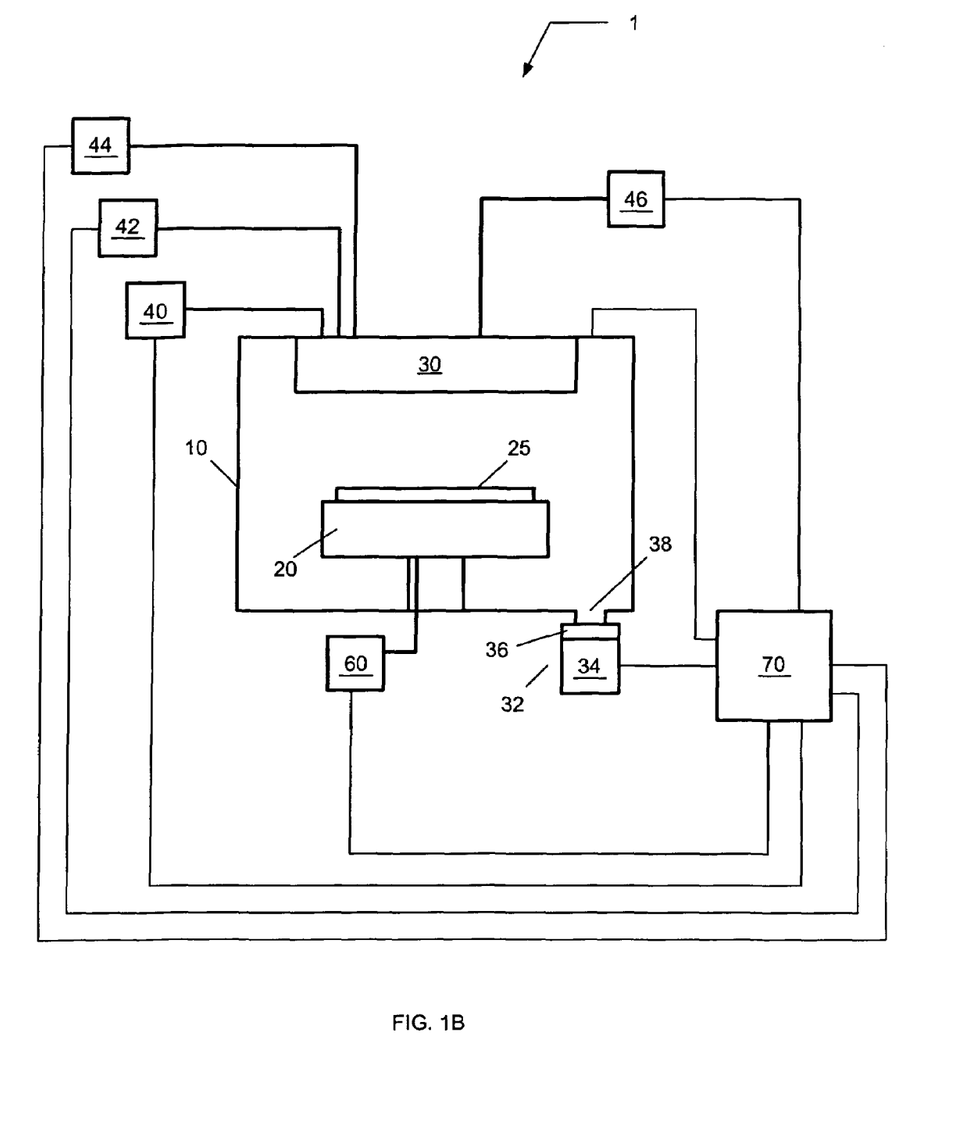
FIG. 1B illustrates a processing system for forming a strained SiN film on a substrate according to an embodiment of the invention.

FIG. 1B illustrates a processing system 1 for forming a strained SiN film on a substrate according to an embodiment of the invention. The processing system 1 can be configured to perform an ALD process, a CVD process, or a pulsed CVD process or a combination of two or more of these processes. The processing system 1 includes a process chamber 10 having a substrate holder 20 configured to support a substrate 25, upon which the strained SiN film is formed. The process chamber 10 further contains an upper assembly 30 (e.g., a showerhead) configured for introducing process gases into the process chamber 10. The upper assembly 30 is coupled to a silicon precursor supply system 40, a first nitrogen precursor gas supply system 42, a second nitrogen precursor gas supply system 44, and a purge gas supply system 46. Additionally, the processing system 1 includes a substrate temperature control system 60 coupled to substrate holder 20 and configured to elevate and control the temperature of the substrate 25.

Furthermore, the processing system 1 includes a controller 70 that can be coupled to process chamber 10, substrate holder 20, upper assembly 30, silicon precursor supply system 40, first nitrogen precursor supply system 42, second nitrogen precursor supply system 44, purge gas supply system 46, and substrate temperature control system 60. Alternatively, or in addition, controller 70 can be coupled to one or more additional controllers/computers (not shown), and controller 70 can obtain setup and/or configuration information from an additional controller/computer.

In FIG. 1B, singular processing elements (10, 20, 30, 40, 42, 44, 46, and 60) are shown, but this is not required for the invention. The processing system 1 can include any number of processing elements having any number of controllers associated with them, in addition to independent processing elements.

The controller 70 can be used to configure any number of processing elements (10, 20, 30, 40, 42, 44, 46, and 60), and the controller 70 can collect, provide, process, store, and display data from processing elements. The controller 70 can contain a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1B, the processing system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while embodiments of the invention are described in connection with the processing of a semiconductor substrate, the invention is not limited solely thereto.

The silicon precursor supply system 40, first nitrogen precursor supply system 42, and the second nitrogen precursor supply system 44 are configured to alternately or simultaneously introduce gases to process chamber 10. The alternation of the introduction of the gases can be cyclical, or it may be acyclical with variable time periods between introduction of the silicon precursor and the first and second nitrogen precursors. Furthermore, each of the first nitrogen precursor supply system 42 and the second nitrogen precursor supply system 44 may each be configured to alternately or simultaneously introduce different nitrogen precursors to the process chamber 10.

Still referring to FIG. 1B, the purge gas supply system 44 is configured to introduce a purge gas to process chamber 10. For example, the introduction of a purge gas may occur between introduction of pulses of a silicon precursor and a nitrogen precursor to the process chamber 10. The purge gas can comprise an inert gas, such as a noble gas (i.e., He, Ne, Ar, Kr, Xe), nitrogen ($N_2$), or hydrogen ($H_2$).

Furthermore, the substrate temperature control system 60 is coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers, which can be included in the substrate holder 20, as well as the chamber wall of the processing chamber 10 or any other component within the processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a strained SiN film from particular silicon and nitrogen precursors on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 of FIG. 1B is further coupled to a pressure control system 32, including a vacuum pumping system 34, a valve 36, and a duct 38, wherein the pressure control system 32 is configured to controllably evacuate the process chamber 10 to a pressure suitable for forming the SiN film on substrate 25. The vacuum pumping system 34 can include a turbo-molecular vacuum pump (TMP) or a cryogenic pump, and valve 36 can include a gate valve for throttling the chamber pressure. Moreover, a device for monitoring chamber pressure (not shown) can be coupled to the processing chamber 10. The pressure measuring device can be an absolute capacitance manometer. The pressure control system 32 can, for example, be configured to control the process chamber pressure between about 0.1 Torr and about 100 Torr during deposition of the SiN film.

The silicon precursor supply system 40, first nitrogen precursor supply system 42, second material supply system 44, and purge gas supply system 46 can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec.

Still referring to FIG. 1B, controller 70 can comprise a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, silicon precursor supply system 40, first nitrogen precursor supply system 42, second nitrogen precursor supply system 44, purge gas supply system 46, substrate temperature control system 60, and pressure control system 32. For example, a program stored in the memory may be utilized to activate the inputs to the aforementioned components of the processing system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention, and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one, or on a combination, of computer readable media is software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

Alternately, a batch processing system capable of processing multiple substrates simultaneously may be utilized for forming the strained SiN films described in the embodiments of the invention.

Figure 2:
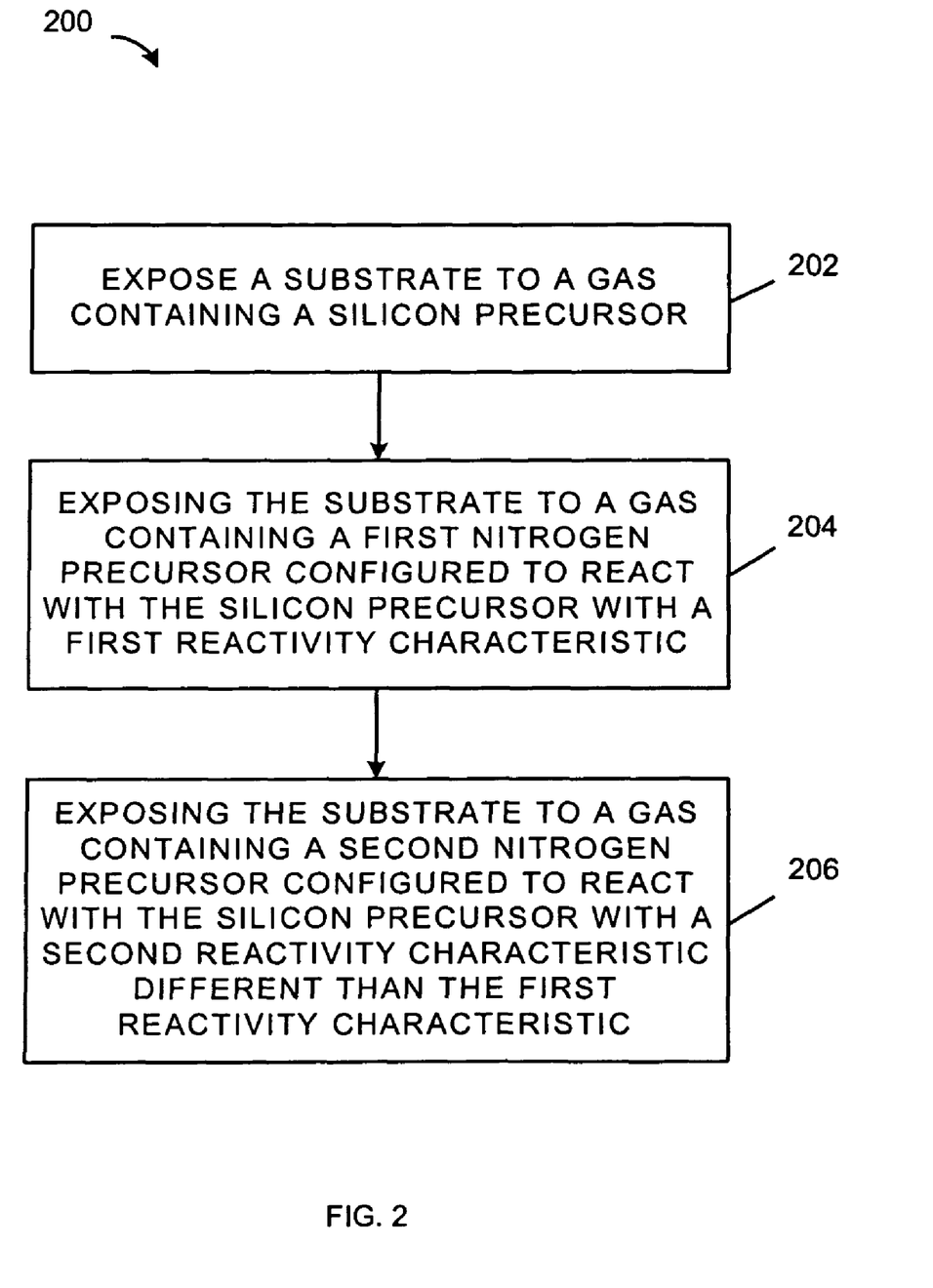
FIGS. 2-6 are process flow diagrams for forming a strained SiN film according to embodiments of the present invention.

FIG. 2 is a process flow diagram for forming a strained SiN film on a substrate in a processing chamber according to an embodiment of the present invention. The process of FIG. 2 may be performed to form a CMOS structure such as that shown in of FIG. 1A, for example, and may be performed in a process system such as the system 1 of FIG. 1B, for example. As seen in FIG. 2, the process begins in step 202 with exposing the substrate to a gas containing a silicon precursor. The silicon precursor can, for example, include silane, disilane, monochlorosilane, dichlorosilane, trichlorosilane, hexachlorodisilane, diethylsilane, di-isopropylaminosilane, bis(tert-butylamino)silane, tetrakis(dimethylamino)silane, tetrakis(ethylmethylamino)silane, tetrakis(diethylamino)silane, tris(dimethylamino)silane, tris(ethylmethylamino)silane, tris(diethylamino)silane, or tris(dimethylhydrazino)silane, or a combination of two or more thereof. The gas of the silicon precursor can further contain an inert gas such as Ar.

In step 204, the substrate is exposed to a gas containing a first nitrogen precursor configured to react with the silicon precursor with a first reactivity characteristic. For example, the first nitrogen precursor may react with silicon within a processing space of the chamber, or with silicon adsorbed on a surface of the substrate, or both. In step 206, the substrate is exposed to a gas containing a second nitrogen precursor configured to react with the silicon precursor with a second reactivity characteristic different than the first reactivity characteristic. As used herein, the term reactivity characteristic refers to any characteristic of the reaction between nitrogen and silicon precursors that affects a property of the SiN formed therefrom. For example, different reactivity characteristics may be expected based on different heat of formation (ΔH) for the first and second nitrogen precursors which provides different heat of formation for the SiN film. A property affected by a reactivity characteristic can be density of the SiN film. More specifically, the first and second nitrogen precursors can, for example, be selected from ammonia, hydrazine, and $C_1$-$C_{10}$ alkylhydrazine compounds. According to one embodiment, the first and second nitrogen precursors are selected from ammonia and hydrazine. The gas can further contain an inert gas such as Ar.

The steps of FIG. 2 can be continued for a predetermined time or repeated a predetermined number of times until a strained SiN film with a desired thickness has been deposited onto the substrate. Further, the sequence of steps 202, 204 and 206 in the method of FIG. 2 can vary widely in accordance with embodiment of the present invention. For example, the silicon precursor, first nitrogen precursor and second nitrogen precursor can be provided in the process chamber as discrete pulses having no temporal overlap, as with the ALD process discussed below. Alternatively, all precursors can be provided simultaneously, while simply varying the relative amounts of gasses. Some combination of these methods may also be used. For example, the silicon precursor can be continuously provided to the chamber while the first and second nitrogen precursors are pulsed, or both the silicon and first nitrogen precursors can be continuously provided, while the second nitrogen precursor is pulsed. As would be understood by one of ordinary skill in the art, various combinations are possible, and embodiments of the invention are not limited by the specific examples described in FIG. 3-6 below.

Thus, the present inventors have discovered that exposing the substrate to different nitrogen precursors having different reactivity characteristics with the silicon precursor can cause a strain the SiN layer. Thus, a strained SiN layer can be formed as the SiN layer is deposited, rather than by the conventional method of post processing. Thus, embodiments of the present invention may reduce production time and equipment necessary for forming a strained SiN film. Further, the strain provided during forming of the SiN film may be better controlled than post processing methods. For example, a predetermined strain gradient throughout the SiN film (rather than in only a surface region) can be provided by a particular process recipe for forming the strained SiN film. In particular, processing conditions such as the type of precursors used, the relative amounts of precursors used, exposure time to each precursor can be set to provide a predetermined strain in the SiN film.

Still further, embodiments of the invention allow forming of the strained SiN film using ALD, CVD or pulsed CVD processes, as will be discussed below. In this regard, reduced production time resulting from providing the strain during formation of the SiN layer may allow a strained SiN film to be formed by an ALD process in less time than conventional CVD and post processing processes. Further, the invention may also provide better control of thickness and conformality of the SiN layer than CVD methods currently in practice.

Figure 3:
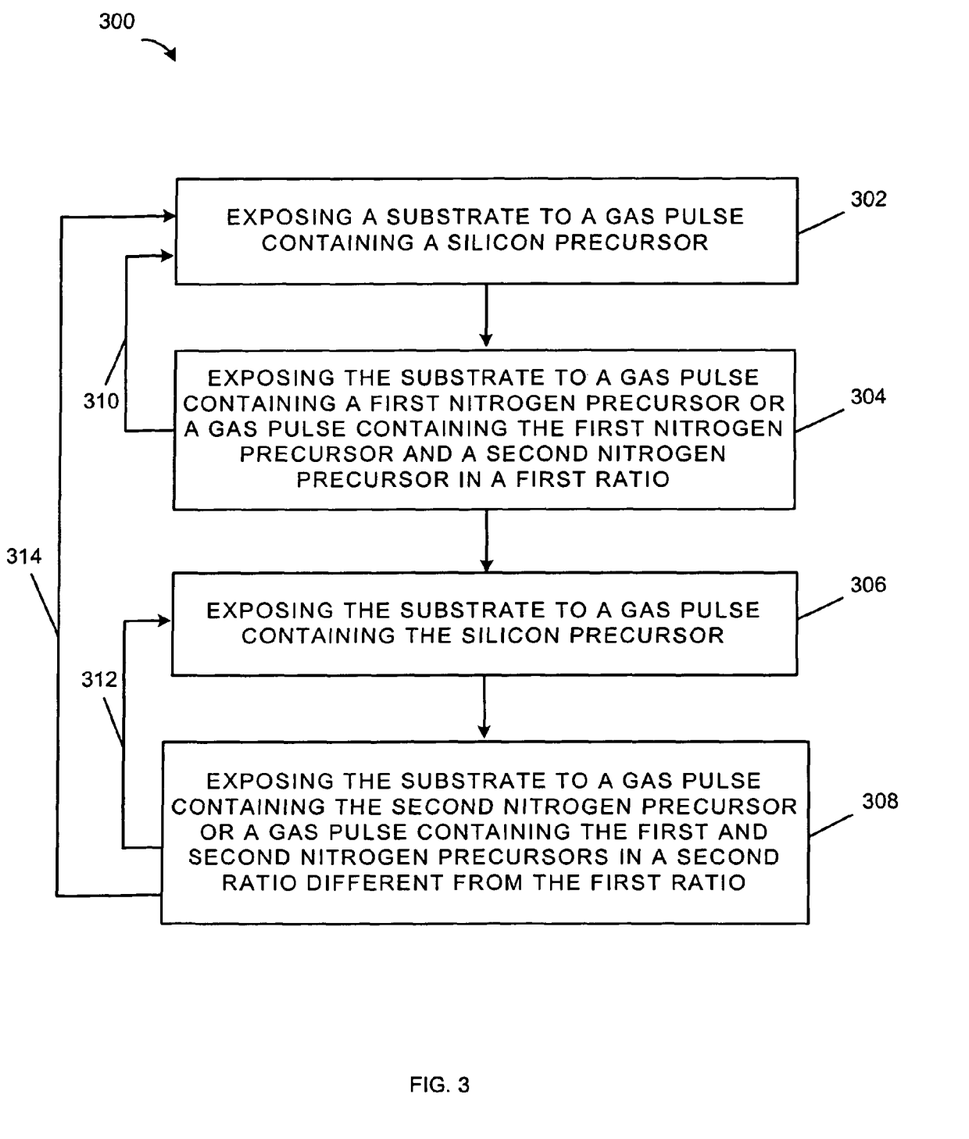

FIG. 3 is a process flow diagram for forming a strained SiN film according to an embodiment of the present invention. The process 300 is an ALD process that includes sequential gas exposures of a silicon precursor and nitrogen precursors with no temporal overlap between the different gas pulses.

The process 300 includes, in step 302, exposing a substrate to a gas pulse of a silicon precursor. The silicon precursor can, for example, include any of the precursors discussed above with respect to FIG. 2.

In step 304, the substrate is exposed to a gas pulse containing a first nitrogen precursor or a gas pulse containing the first nitrogen precursor and a second nitrogen precursor. As noted above, the first and second nitrogen precursors can, for example, be selected from ammonia, hydrazine, and $C_1$-$C_{10}$ alkylhydrazine compounds. According to one embodiment, the first and second nitrogen precursors are selected from ammonia and hydrazine. The gas pulse can further contain an inert gas such as Ar.

In step 306, the substrate is exposed to a second gas pulse of the silicon precursor. The second gas pulse can further contain an inert gas such as Ar.

In step 308, the substrate is exposed to a gas pulse containing the second nitrogen precursor or a gas pulse containing the first nitrogen precursor and the second nitrogen precursor in a second ratio different from the first ratio. The gas pulse can further contain an inert gas such as Ar.

The steps 302-308 may be repeated a predetermined number of times as shown by the process flow 314 until a strained SiN film with a desired thickness has been deposited onto the substrate. The process chamber may be purged with an inert gas, evacuated, or both purged and evacuated after each of steps 302, 304, 306, and 308.

According to one embodiment, steps 302 and 304 may be sequentially performed a first number of times as shown by the process flow 310, prior to performing steps 306 and 308.

According to another embodiment, steps 306 and 308 may be sequentially performed a second number of times as shown by the process flow 312, prior to repeating steps 302 and 304 in the process flow 314.

According to yet another embodiment, steps 302 and 304 may be sequentially performed a first number of times prior to performing steps 306 and 308 as shown by the process flow 310, and steps 306 and 308 may be sequentially performed a second number of times as shown by the process flow 312, prior to repeating steps 302 and 304 in the process flow 314.

According to one embodiment, step 304 comprises exposing the substrate to a gas pulse of a first nitrogen precursor and step 308 comprises exposing the substrate to a gas pulse of a second nitrogen precursor. Furthermore, steps 302 and 304 may be sequentially performed a first number of times as shown by the process flow 310, prior to performing steps 306 and 308. Furthermore, steps 306 and 308 may be sequentially performed a second number of times as shown by the process flow 312, prior to repeating steps 302 and 304 in the process flow 314.

According to one embodiment, step 304 comprises exposing the substrate to a gas pulse of a first nitrogen precursor and step 308 comprises exposing the substrate to a gas pulse of a second nitrogen precursor. Furthermore, steps 302 and 304 may be sequentially performed a first number of times as shown by the process flow 310, thereafter steps 306 and 308 may be sequentially performed a second number of times as shown by the process flow 312, prior to repeating steps 302 and 304 in the process flow 314.

According to one embodiment, the first number of times may decrease monotonically and the second number of times may increase monotonically each time process flow 314 is performed. In one example, in step 302, the substrate is exposed to a gas pulse of a silicon precursor, in step 304, the substrate is exposed to a gas pulse of a first nitrogen precursor, and steps 302 and 304 are repeating twice using the process flow 310. Thereafter, in step 306, the substrate is exposed to a gas pulse of the silicon precursor, and in step 308, the substrate is exposed to a gas pulse of a second nitrogen precursor. Next, in step 302, the substrate is exposed to a gas pulse of the silicon precursor, in step 304, the substrate is exposed to a gas pulse of the first nitrogen precursor, and steps 302 and 304 are repeated once using the process flow 310. Thereafter, in step 306, the substrate is exposed to a gas pulse of the silicon precursor, in step 308, the substrate is exposed to a gas pulse of the second nitrogen precursor, and steps 306 and 308 are repeating once using the process flow 312. Next, in step 302, the substrate is exposed to a pulse gas pulse of the silicon precursor, and in step 304, the substrate is exposed to a gas pulse of the first nitrogen precursor. Thereafter, in step 306, the substrate is exposed to a gas pulse of the silicon precursor, in step 308, the substrate is exposed to a gas pulse of the second nitrogen precursor, and steps 306 and 308 are repeated twice using process flow 312. In this example, the first number of times decreases from 3 to 2 to 1 and the second number of times increases from 1 to 2 to 3 during deposition of the strained SiN film. In one example, the first and second nitrogen precursors can be selected from ammonia and hydrazine.

According to one embodiment, step 304 includes exposing the substrate to gas pulse containing a first nitrogen precursor and a second nitrogen precursor in a first ratio, and step 308 includes exposing the substrate to a gas pulse containing the first and second nitrogen precursors in a second ratio different from the first ratio. According to one embodiment, the ratio of the first and second nitrogen precursors can monotonically increase or decrease during deposition of the SiN film.

Figure 4:
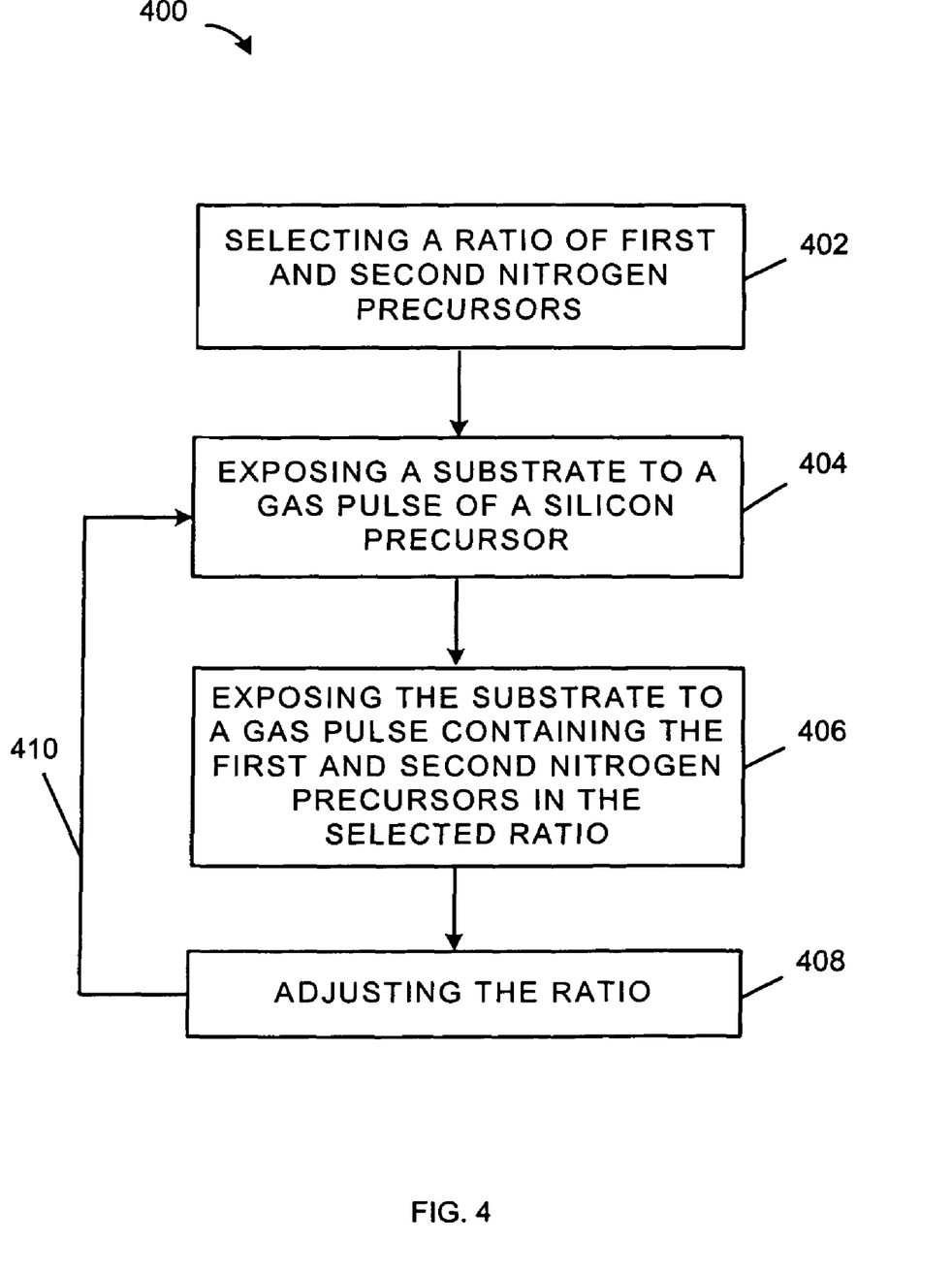

FIG. 4 is a process flow diagram for forming a strained SiN nitride film according to another embodiment of the present invention. The process 400 includes, in step 402, selecting a ratio of first and second nitrogen precursors. The ratio may, for example, be defined as $N_1/N_2$ or $N_1/(N_1+N_2)$, where $N_1$ and $N_2$ refer to the amounts of the first and second nitrogen precursors, respectively. The first and second nitrogen precursors can, for example, be selected from ammonia, hydrazine, and $C_1$-$C_{10}$ alkylhydrazine compounds. According to one embodiment, the first and second nitrogen precursors are selected from ammonia and hydrazine. The gas pulse can further contain an inert gas such as Ar.

In step 404, a substrate is exposing to a gas pulse of a silicon precursor. The silicon precursor can, for example, include silane, disilane, monochlorosilane, dichlorosilane, trichlorosilane, hexachlorodisilane, diethylsilane, di-isopropylaminosilane, bis(tert-butylamino)silane, tetrakis(dimethylamino)silane, tetrakis(ethylmethylamino)silane, tetrakis(diethylamino)silane, tris(dimethylamino)silane, tris(ethylmethylamino)silane, tris(diethylamino)silane, or tris(dimethylhydrazino)silane, or a combination of two or more thereof.

In step 406, the substrate is exposed to a gas pulse containing the selected ratio of the first and second nitrogen precursors. In addition to the first and second nitrogen precursors, the gas pulse can further contain an inert gas such as Ar.

In step 408, the ratio of the first and second nitrogen precursors is adjusted. According to one embodiment, the ratio can be increased or decreased each time step 408 is performed. It will be readily apparent to those skilled in the art that the ratio of the first and second nitrogen precursors is easily varied using variable mass flow controllers that may be programmed during the SiN deposition.

Next, steps 404 and 406 are repeated before the ratio is adjusted again in step 408. Steps 404-408 are repeated a predetermined number of times until a strained SiN film with a desired thickness has been deposited on the substrate. According to one embodiment, the first and second nitrogen precursors are selected from ammonia and hydrazine.

In one example, during the process 400, the ratio $N_1/(N_1+N_2)$ may increase as 0, 0.05, 0.10, . . . , 0.90, 0.95, and 1.0, during deposition of the SiN film. In this example, steps 404 and 406 are performed 21 times. The above ratios and number of times steps 404 and 406 performed are only exemplary, as any ratios may be used and steps 404 and 406 may be performed any number of times to affect the properties of the deposited SiN film, such as density, strain etc.

Figure 5:
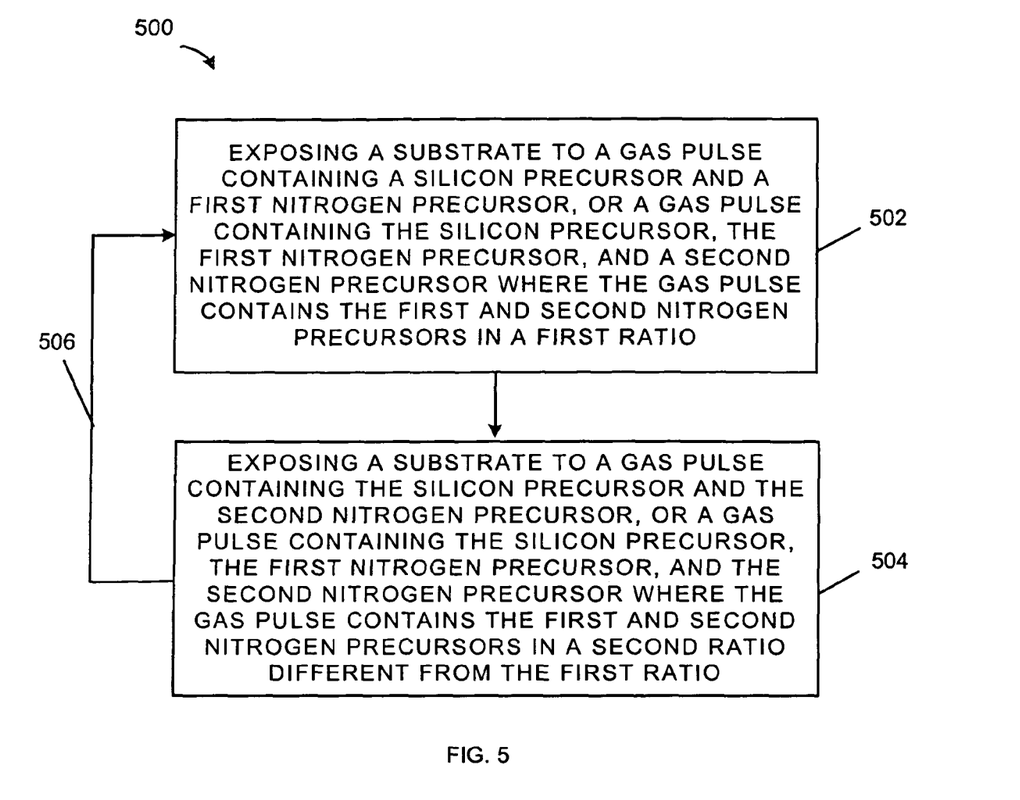

FIG. 5 is a process flow diagram for forming a strained SiN film according to still another embodiment of the present invention. The process 500 is a pulsed CVD process that includes interrupted gas exposures of a silicon precursor and different nitrogen precursors with at least some temporal overlap between some of the gas pulses.

The process 500 includes, in step 502, exposing a substrate to a gas pulse containing a silicon precursor and a first nitrogen precursor, or a gas pulse containing the silicon precursor, the first nitrogen precursor, and a second nitrogen precursor where the gas pulse contains the first and second nitrogen precursors in a first ratio. The silicon precursor can, for example, include silane, disilane, monochlorosilane, dichlorosilane, trichlorosilane, hexachlorodisilane, diethylsilane, di-isopropylaminosilane, bis(tert-butylamino)silane, tetrakis(dimethylamino)silane, tetrakis(ethylmethylamino)silane, tetrakis(diethylamino)silane, tris(dimethylamino)silane, tris(ethylmethylamino)silane, tris(diethylamino)silane, or tris(dimethylhydrazino)silane, or a combination of two or more thereof. The first and second nitrogen precursors can, for example, be selected from ammonia, hydrazine, and $C_1$-$C_{10}$ alkylhydrazine compounds.

In step 504, the substrate is exposed to a gas pulse containing a silicon precursor and the second nitrogen precursor, or a gas pulse containing the silicon precursor, the first nitrogen precursor, and the second nitrogen precursor, where the gas pulse contains the first and second nitrogen precursors in a second ratio different from the first ratio.

Steps 502 and 504 may be performed a predetermined number times as shown by process flow 506.

Figure 6:
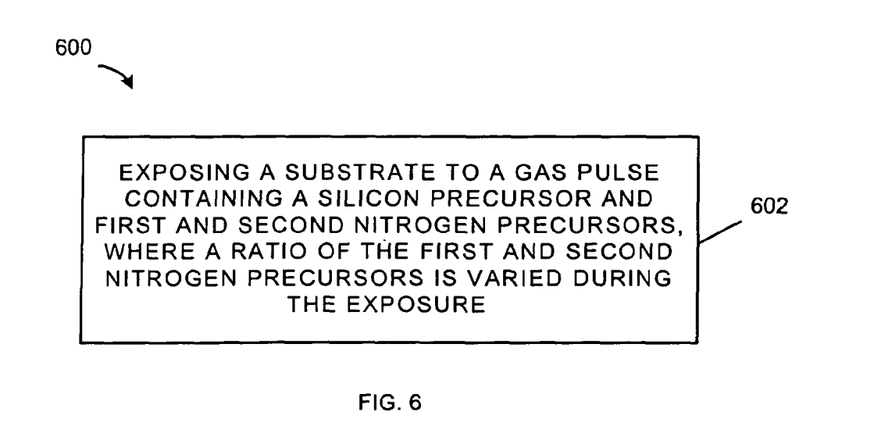

FIG. 6 is a process flow diagram for forming a strained SiN film according to yet another embodiment of the present invention. The process 600 is a CVD process that includes non-interrupted gas exposures of a silicon precursor and different nitrogen precursors.

The process 600 includes, in step 602, exposing the substrate to a gas pulse containing a silicon precursor and first and second nitrogen precursors, where the ratio of the first and second nitrogen precursors is varied during the exposure. According to one embodiment, the ratio may be varied from ratio corresponding to substantially pure first nitrogen precursor, to a another ratio corresponding to a combination of the first and second nitrogen precursors, to yet another ratio corresponding to substantially pure second nitrogen precursor. In one example, the ratio can change monotonically during the deposition of the SiN film. The silicon precursor can, for example, include silane, disilane, monochlorosilane, dichlorosilane, trichlorosilane, hexachlorodisilane, diethylsilane, di-isopropylaminosilane, bis(tert-butylamino)silane, tetrakis(dimethylamino)silane, tetrakis(ethylmethylamino)silane, tetrakis(diethylamino)silane, tris(dimethylamino)silane, tris(ethylmethylamino)silane, tris(diethylamino)silane, or tris(dimethylhydrazino)silane, or a combination of two or more thereof. The first and second nitrogen precursors can, for example, be selected from ammonia, hydrazine, and $C_1$-$C_{10}$ alkylhydrazine compounds.

While the invention has been illustrated by the description of several embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative systems and method and illustrative examples shown and described. Accordingly, departures may be made from such details without departing from the scope of the general inventive concept.

The invention claimed is:

1. A method of depositing a strained SiN film on a substrate in a process chamber, comprising:
   a) exposing the substrate to a first gas pulse comprising a silicon precursor;
   b) exposing the substrate to a gas pulse comprising a first nitrogen precursor, or a gas pulse comprising the first nitrogen precursor and a second nitrogen precursor in a first ratio, configured to react with the silicon precursor of the first gas pulse with a first reactivity characteristic to form a first SiN layer having a first density;
   c) exposing the substrate to a second gas pulse comprising the silicon precursor; and
   d) exposing the substrate to a gas pulse comprising the second nitrogen precursor, or a gas pulse comprising the first and second nitrogen precursors in a second ratio different from the first ratio, configured to react with the silicon precursor of the second gas pulse with a second reactivity characteristic different than said first reactivity characteristic to form, on the first SiN layer, a second SiN layer having a second density different from the first density, such that a property of the SiN film formed on the substrate changes to provide the strained SiN film, and e) repeating the steps a)-d) a predetermined number of times, wherein a separate gas pulse comprising the silicon precursor is exposed to the substrate for each gas pulse comprising the first nitrogen precursor or the first and second nitrogen precursors in the first ratio, and for each gas pulse comprising the second nitrogen precursor or the first and second nitrogen precursors in the second ratio.

2. The method of claim 1, further comprising sequentially performing the steps a) and b) a first number of times prior to performing the steps c) and d).

3. The method of claim 1, further comprising sequentially performing the steps c) and d) a second number of times prior to repeating the steps a) and b) in the step e).

4. The method of claim 1, further comprising sequentially performing the steps a) and b) a first number of times prior to performing the steps c) and d), and sequentially performing the steps c) and d) a second number of times prior to repeating the steps a) and b) in the step e).

5. The method of claim 1, wherein the step b) comprises exposing the substrate to the gas pulse of the first nitrogen precursor, the step d) comprises exposing the substrate to the gas pulse of the second nitrogen precursor, and the method further comprises sequentially performing the steps a) and b) a first number of times prior to performing the steps c) and d).

6. The method of claim 1, wherein the step b) comprises exposing the substrate to the gas pulse of the first nitrogen precursor, the step d) comprises exposing the substrate to the gas pulse of the second nitrogen precursor, and the method further comprises sequentially performing the steps c) and d) a second number of times prior to repeating the steps a) and b) in the step e).

7. The method of claim 1, wherein the step b) comprises exposing the substrate to a pulse of the first nitrogen precursor, the step d) comprises exposing the substrate to a pulse of the second nitrogen precursor, and the method further comprises sequentially performing the steps a) and b) a first number of times prior to performing the steps c) and d), and sequentially performing the steps c) and d) a second number of times prior to repeating the steps a) and d) in the step e).

8. The method of claim 7, wherein the first number of times decreases monotonically and the second number of times increases monotonically during the deposition of the SiN film.

9. The method of claim 1, wherein the step b) comprises exposing the substrate to a pulse comprising a first and second nitrogen precursor in a first ratio, and the step d) comprises exposing the substrate to the first and second nitrogen precursors in a second ratio different from the first ratio.

10. The method of claim 9, wherein the step e) further comprises monotonically increasing or decreasing the first and second ratios during deposition of the SiN film.

11. The method of claim 1, wherein the silicon precursor comprises silane, disilane, monochlorosilane, dichlorosilane, trichlorosilane, hexachlorodisilane, diethylsilane, or an alkylaminosilane, or a combination of two or more thereof.

12. The method of claim 11, wherein the alkylaminosilane comprises di-isopropylaminosilane, bis(tert-butylamino)silane, tetrakis(dimethylamino)silane, tetrakis(ethylmethylamino)silane, tetrakis(diethylamino)silane, tris(dimethylamino)silane, tris(ethylmethylamino)silane, tris(diethylamino)silane, or tris(dimethylhydrazino)silane, or a combination of two or more thereof.

13. The method of claim 1, wherein
the first nitrogen precursor is one of ammonia, hydrazine, and $C_1$-$C_{10}$ hydrazine compounds, and
the second nitrogen precursor is another one of the ammonia, hydrazine, and $C_1$-$C_{10}$ hydrazine compounds.

14. The method of claim 1, further comprising purging, evacuating, or purging and evacuating the process chamber after each of the steps a)-d).

15. The method of claim 1, wherein the steps a) and b) have at least partial temporal overlap.

16. The method of claim 1, wherein the steps c) and d) have at least partial temporal overlap.

17. The method of claim 1, wherein the steps a) and b) have at least partial temporal overlap and the steps c) and d) have at least partial temporal overlap.

18. A semiconductor device comprising a strained SiN film deposited according to claim 1.

* * * * *